US006998621B2

(12) United States Patent
Harris

(10) Patent No.: US 6,998,621 B2
(45) Date of Patent: Feb. 14, 2006

(54) COOLING OF A DEVICE FOR INFLUENCING AN ELECTRON BEAM

(75) Inventor: Paul George Harris, Haverhill (GB)

(73) Assignee: Leica Microsystems Lithography Ltd., Cambridge (GB)

( * ) Notice: Subject to any disclaimer, the term of this patent is extended or adjusted under 35 U.S.C. 154(b) by 61 days.

(21) Appl. No.: 10/760,843

(22) Filed: Jan. 20, 2004

(65) Prior Publication Data

US 2004/0144931 A1   Jul. 29, 2004

(30) Foreign Application Priority Data

Jan. 24, 2003   (GB)   .................................. 0301730

(51) Int. Cl.
*H01J 37/26*   (2006.01)
(52) U.S. Cl. ........................ 250/396 R; 250/396 ML
(58) Field of Classification Search ............ 250/396 R, 250/396 ML
See application file for complete search history.

(56) References Cited

U.S. PATENT DOCUMENTS

| | | | | |
|---|---|---|---|---|
| 4,296,804 A | * | 10/1981 | Press et al. .................. | 165/133 |
| 4,644,217 A | | 2/1987 | Hoet et al. ..................... | 313/35 |
| 5,136,166 A | * | 8/1992 | Young .................. | 250/396 ML |
| 5,629,526 A | | 5/1997 | Nakasuji ..................... | 250/396 |
| 5,847,399 A | * | 12/1998 | Schmitt et al. ...... | 250/396 ML |
| 6,053,241 A | * | 4/2000 | Kendall .................. | 165/104.33 |
| 6,486,605 B1 | | 11/2002 | Beunas et al. ............. | 315/5.35 |

FOREIGN PATENT DOCUMENTS

| | | |
|---|---|---|
| GB | 1098865 | 1/1968 |
| GB | 2 175 134 | 11/1986 |

\* cited by examiner

*Primary Examiner*—John R. Lee
*Assistant Examiner*—David A. Vanore
(74) *Attorney, Agent, or Firm*—Houston Eliseeva LLP

(57) ABSTRACT

A device for influencing an electron beam, in particular a beam deflector (10), comprises a cylindrical support body (11) with an axial passage (12) through which the beam can propagate and axially spaced sets of coils (14) supported by the body and operable by electrical energy to produce electromagnetic fields for deflection of the beam. The device includes a cooling system for counteracting temperature rise in the body (11) due to operation of the coils (14). The system comprises a pipe (15) of compliant material extending helically around and thermally conductively coupled, preferably adhesively bonded, to the support body (11) and serving to conduct liquid coolant for heat exchange with the body (11) over substantially all the external circumferential surface thereof. The cooling system further includes a pump (16) for conveying the coolant through the pipe (15) in a generally laminar flow so that, in conjunction with the flow path and pipe material, generation of vibrations is largely avoided and any vibrations that are generated are absorbed by the pipe (15) rather than transmitted to the body (11).

23 Claims, 1 Drawing Sheet

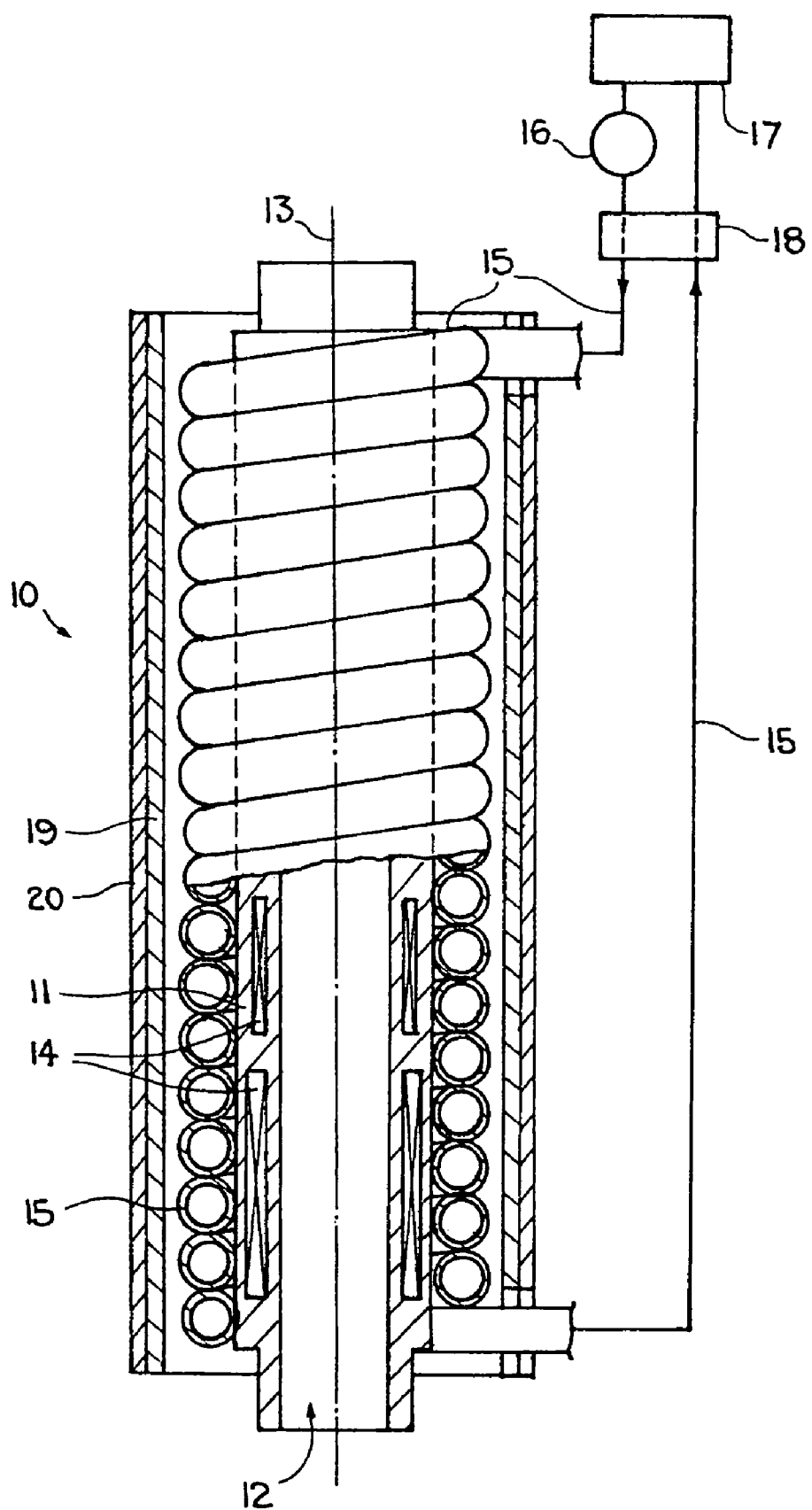

COOLING OF A DEVICE FOR INFLUENCING AN ELECTRON BEAM

RELATED APPLICATIONS

This application claims priority of the British patent application 03 01 730.8 which is incorporated by reference herein.

FIELD OF THE INVENTION

The present invention relates to a device for influencing an electron beam and has particular reference to cooling of the device.

BACKGROUND OF THE INVENTION

Devices for influencing electron beams include, inter alia, beam focussing lenses, beam deflector assemblies and other such units which are incorporated in equipment generating electron beams and which serve for focussing, deflecting or otherwise influencing a beam along its path within the equipment. Devices of this kind are frequently operated by electrical energy which may give rise to a considerable output of heat, the dissipation of which can be problematic in the confines of electron beam equipment. If excessive heat is not removed it can have a relatively significant effect, particularly due to component displacement resulting from expansion and contraction, on sensitive devices influencing beam position in fine tolerance ranges. For example, in the case of a beam deflecting assembly with coils carried by a coil former, increase in the coil wire temperature and consequent increase in the coil former body temperature lead to expansion of the coils and the body, which in turn disturbs the electromagnetic fields produced by the coils and has a deleterious effect on the beam position. This problem is exacerbated by the higher electron accelerating voltage employed in some equipment, as stronger electromagnetic fields are then required for beam deflection and thus greater operating current for the coils and increased heat output.

Attempts to cool beam deflecting and other beam influencing assemblies by use of gaseous or liquid coolants have not met with conspicuous success, primarily because the cooling systems themselves were often a source of vibration or other disturbance. Direct immersion of coils in an inert liquid coolant proved susceptible to pressure fluctuations liable to deform or displace the coil unit of the assembly. An integrated cooling system of this kind, albeit applied to electromagnetic lenses, is disclosed in DE 36 100 73 C2, where an excitation winding is accommodated in a annular housing partly filled with refrigerant in which the winding is immersed. Refrigerant vaporised by the heat of the winding is condensed by heat exchange with refrigerant flowing in heat-exchange tubes similarly accommodated in the housing and located above the level of the refrigerant bath in which the winding is immersed. The cooling system, inclusive of refrigerant feeds and valves, is bulky and space-consuming and is composed of a significant number of additional components which can themselves function as heat sinks and consequently sources of contraction and expansion prejudicing the maintenance of an accurate beam position.

A more compact integrated cooling system is disclosed in U.S. Pat. No. 5,629,526, in which cooling water is conducted by internal and external ducts to a cooling chamber directly adjoining a coil of an electromagnetic lens, the coil having a polyimide coating. The cooling is directed specifically to the coil and, apart from some influence on a surrounding core through which the ducts pass, the cooling effect is highly localised. The system is consequently ineffective for cooling any regions spaced from the coil. A potentially significant problem, which may also affect the system of DE 36 100 73 C2, is separation of the liquid in which the coil is immersed from other sensitive components. This is achieved in U.S. Pat. No. 5,629,526 by O-ring seals, but the harsh temperature environment of electron beam equipment is liable to cause early deterioration of seals and thus create a risk of leakage.

An analogous approach to the problem of cooling is embodied in the system described in DE 197 38 009 A. The cathode of an electron beam gun is indirectly heated by a coil inductor consisting of several windings of an electrically highly conductive hollow conductor. The hollow conductor is filled with a coolant such as liquid nitrogen, hydrogen or helium. The coolant serves exclusively to cool the coil windings through which it flows and accordingly the cooling system has no application beyond the specific construction for which it has been designed.

A different approach is provided by U.S. Pat. No. 6,486,605, which relates to a multibeam electron tube. Multiple beams generated by a corresponding number of cathodes and an anode are conducted via a series of drift tubes and cavities in a body to a beam collector. The collector is cooled, and possibly also the body, by an external electrically insulated cooling device in the form of a plastic duct conducting, for example, deionised water; the specific disposition of the duct and the operation and effect of the cooling device are not discussed. The described device serves to cool components at a point before extraction of microwave energy via a waveguide and the cooling device does not need to take into account—and no account is taken—of detrimental influence on electron beam position by the disposition and operation of the cooling device.

SUMMARY OF THE INVENTION

It is therefore the principal object of the present invention to create a means of effectively cooling an electrically operable device for influencing an electron beam, such as a beam deflector, without adverse effect on the beam position.

Other objects and advantages of the invention will be evident from the following description.

According to the present invention there is provided a device for influencing an electron beam, comprising a support body for positioning in the vicinity of an electron beam, beam influencing means supported by the body and operable by electrical energy to influence the beam when the body is so positioned and cooling means for counteracting temperature rise in the body due to operation of the influencing means, but without inducing vibration adversely affecting the stability of beam position, the cooling means comprising a pipe extending externally around and thermally conductively coupled to the body and serving to conduct coolant for heat exchange with the body over at least a major part of the peripheral area thereof substantially without transmission of vibration to the body and displacing means for movement of the coolant through the pipe in a substantially laminar flow.

In the case of such a device the cooling means is arranged to remove heat accumulating in a support body of an electrically-operable beam influencing means, so that the heat has reduced or negligible influence on the beam position. The influencing of the beam can thus be carried out with a high degree of accuracy largely free of thermally-induced displacements that can lead to, for example, errors in the scanning position of a focussed beam spot. The coolant pipe can be constructed and positioned to enable large-area cooling without transmission of vibration and the coolant displacing means is operable to provide a substantially laminar flow and thus avoid generation of pressure fluctuations liable to transmit shocks through the pipe to the body.

To that end, the pipe is preferably made of a compliant material resistant to transmission of vibration, for preference a flexible plastics material such as polyperfluoroalkoxyethylene. Such a material, apart from being heat resistant and electrically non-conductive, has the capacity to largely or entirely absorb any periodic vibration or isolated shock that might occur, without transmission of a corresponding force to the support body. In addition, a pipe of such a material is amenable to winding around the support body—which is likely to be of relatively small diameter and thus impose relatively tight turns on the pipe—without distortion of or, at least, significant change in the pipe cross-section.

In order to assist minimisation of any capability to transmit vibration to the support body the pipe is preferably bonded thereto so that the pipe and body together form a single structure. The bonding, which can be by adhesive means, can also enhance the coefficient of thermal transfer of the pipe relative to the body so as to assist heat exchange between coolant and latent support body heat. If the pipe and body are made of different materials, for example respectively a polymer and ceramic, it can be of advantage if the adhesive means comprises a first adhesive precoated on the exterior of the body and a second adhesive bonding the pipe to the precoating provided by the first adhesive. The adhesives can be selected to fulfil specific requirements, such as resistance to degradation under heat and capability of functioning as a heat conductor.

The pattern of laying of the pipe around the body can be adapted to the specific support body shape and external features, but in its simplest form the pipe is helically wound around the body, preferably in such a manner that mutually adjacent windings of the wound pipe are contiguous.

The displacing means is preferably operable to displace the coolant at a rate of substantially 0.30 to 0.50 liters per hour, which has been found to be sufficient to achieve effective heat exchange without inducing pressure pulsations due to pump effect and to the flow path imposed by the layout of the pipe. The displacing means can be a pump of suitable kind. The cooling means as such preferably forms a closed circuit, which can include a coolant reservoir in which coolant is cooled after heat exchange with the support body. Although a gaseous coolant is usable, a liquid coolant, such as deionised water, is preferred. Deionised water has the advantages of a high specific heat capacity and an inability to support eddy currents and attendant stray magnetic fields.

The support body itself preferably defines a passage for propagation of the electron beam therethrough, in which case the beam influencing means can annularly surround the beam. The influencing means can be, for example, beam deflecting means preferably comprising at least one coil operable by the electrical energy to generate an electromagnetic field for deflecting the beam. The device as a whole can further include a tubular shield of ferrite material surrounding both the body and the pipe and providing shielding against external magnetic interference, the field preferably being spaced from the pipe by a thermally insulating air gap. The shield can, in turn, be surrounded by a titanium supporting and locating casing.

BRIEF DESCRIPTION OF THE DRAWINGS

An embodiment of the present invention will now be more particularly described by way of example with reference to the accompanying drawings, the single FIGURE of which is a schematic, partly sectioned elevation of a beam deflecting device embodying the invention.

DETAILED DESCRIPTION OF THE INVENTION

Referring now to the drawing, there is shown, in highly schematic representation, a beam deflector assembly 10 intended for positioning in an electron beam column in the path of an electron beam generated by an electron gun of the column. The column can be, for example, part of a lithography machine for writing patterns, such as integrated circuits, on appropriate substrates. In that case, the deflector assembly has the function of deflecting the beam to scan the substrate surface along a path coincident with the features of the pattern to be written, the beam acting on, for example, an electron-sensitive resist on the surface. Patterns produced by electron beam scanning in this manner have to be written with a high degree of precision, particularly since it is conventional practice to fracture the patterns into main fields and the main fields into subfields which are written individually and the constituent features of which have to mate without offset or other error at the subfield boundaries. Any unintended displacement of the beam position can have an appreciable effect on pattern accuracy.

Deflection of the beam by the deflector assembly is performed by generation of electromagnetic fields which influence the beam in such a manner that it is generally deflected away from the column axis through a certain angle and then deflected back towards the axis, the final deflection determining the specific scanning path of the beam. Scanning is normally undertaken at a slower rate for coarse positioning of the beam spot between subfields within a main field and at a faster rate for fine positioning of the beam spot within each subfield to write the pattern details associated with that subfield. Scanning at the two rates is accordingly tasked to four separate electromagnetic field zones. In the case of use of higher accelerating voltages for generation of the beam, the electromagnetic fields have to be comparatively strong to achieve diversion of the beam path.

In basic construction the deflector assembly comprises a generally cylindrical support body 11 of plastics material, ceramic or other electrically non-conductive material, the selected material preferably being characterised by a thermal conductivity allowing a high rate of heat dissipation. The support body 11, which can be assembled from several discrete components in axial direction, defines a passage 12 through which the beam propagates along the axis 13 of the passage in the installed state of the assembly. The support body 11 functions as a coil former in the manner that it contains slots and recesses allowing coil wire to be wound to form four axially spaced sets of coils 14, coils of two of the sets being visible in the drawings. Each coil set consists of two pairs of two diametrically opposite coils 14, the coils of one pair being disposed on an axis at 90° to that of the other pair. The disposition of the four coils 14 of each set is such that, when current is applied to the coil pairs at selected levels, electromagnetic fields capable of deflecting the beam in any desired radial direction can be generated. Two alternate coil sets serve to deflect the beam away from and back towards the cylinder axis at the mentioned slower rate. The other two alternate coil sets serve to similarly deflect the beam at the faster rate.

The four sets of coils 14, which in operation of the deflector assembly 10 are likely to be energised almost continuously, generate a substantial amount of heat which produces a significant temperature rise in the support body 11. The heat output is noticeably higher in the case of the stronger electromagnetic fields necessary in conjunction with higher beam accelerating voltages. Even slight thermally-induced expansion, contraction or other physical change in the support body 11 may lead to relative displacement of the coils and consequently detrimental changes in beam position, specifically in the critical location of the beam spot on the substrate surface. The assembly 10 accordingly incorporates a cooling system designed to counteract the temperature rise without acting—as has occurred in the past with known cooling systems—as a source of beam position error in its own right.

The cooling system accordingly comprises a coolant conduit in the form of a circular-section pipe 15 of compliant polymer material, for example polyperfluoroalkoxyethylene, helically wound around the support body 11 over the entire length thereof so that the individual windings are in direct contact with one another and in thermal contact with the external circumferential surface of the body. Movement of the pipe 15 relative to the body 11 is precluded by bonding the windings to the body surface by a suitable adhesive, preferably a cyanoacrylate. If the support body is composed of a non-plastic material, such as ceramic, secure adhesion of the pipe 15 can be ensured by precoating the circumferential surface of the support body 11 with a cyanoacrylate with good bonding properties in relation to ceramic so as to form a precoating on the surface and then bonding the pipe to the precoating by a cyanoacrylate with good bonding properties in relation to polymeric materials.

The compliant nature of the pipe 15, i.e. a soft pliability promoting absorption rather than transmission of vibrations or shock loads, and the fixed connection with the support body 11 achieved by the adhesive bonding results in a conduit through which coolant can flow with minimum tendency to impart any disturbance to the support body and supported coils. The steady helical course of the pipe 15 provides a uniform flow path free of abrupt changes in direction likely to produce pressure surges or other flow-sourced vibration.

In order to further reduce any possibility of disturbance from the coolant flow the cooling system includes, for displacement of the coolant, a pump 16 operating to convey the coolant at a low flow rate of approximately 0.30 to 0.50 liters per hour. Such a rate ensures that the coolant has the opportunity to provide effective heat exchange with the support body 11 heated up during operation of the coils 14, but without itself becoming excessively heated. In addition, the low flow rate, assisted by the smooth flow path defined by the pipe 15, achieves a substantially laminar flow free of pressure transience. The cooling system inclusive of the pump 16 forms a closed circuit with constant recirculation of the coolant, the circuit also including a reservoir 17 with a bath of coolant and with a means of cooling the coolant before return to the pipe windings at the support body 11. As shown in the drawing, the pipe 15 includes inlet and outlet tracts connected to the pump 16 and reservoir 17 by way of a junction block 18.

The coolant can be deionised water which has a high specific heat capacity and is effectively incapable of sustaining parasitic electromagnetic fields. The coolant temperature can typically be approximately 18 to 21° C.

The support body and pipe windings are surrounded at a spacing, which forms an air gap, by a tube 19 of ferritic material acting as a shield against interfering magnetic fields. The shielding tube 19 is in turn surrounded by a titanium supporting and locating casing 20 enclosing these components. The air gap acts as a thermal insulator to reduce or prevent heat transfer to the tube 19 and casing 20; transferred heat otherwise has an adverse effect on the ferrite material of the tube and is liable to cause movement of the casing and thus displacement of the deflector assembly.

Tests conducted to establish the efficiency of the cooling system incorporated in a beam deflecting assembly in an electron beam lithography machine using a high accelerating voltage showed that, with the deflecting coils de-energised and thus no heat output into the support body, substantially the same thermally-induced drift of the beam spot was present regardless of whether the cooling system was functioning or non-functioning. Consequently, it could be concluded that operation of the system did not itself contribute any disturbance producing drift. With the coils energised, however, thermal drift was improved when the cooling system was in operation. The test indicated that the cooling system did not eradicate drift, but reduced it to a level generally accepted in the case of machines functioning with lower beam accelerating voltages.

What is claimed is:

1. A device for influencing an electron beam, comprising a support body for positioning in the vicinity of an electron beam, beam influencing means supported by the body and operable by electrical energy to influence the beam when the body is so positioned and cooling means for counteracting temperature rise in the body due to operation of the influencing means, but without inducing vibration adversely affecting the stability of beam position, the cooling means comprising a pipe extending externally around and thermally conductively coupled to the body and serving to conduct coolant for heat exchange with the body over at least a major part of the peripheral area thereof substantially without transmission of vibration to the body and displacing means for movement of the coolant through the pipe in a substantially laminar flow, wherein the pipe is bonded to the support body by adhesive means and wherein the body and the pipe are made of different materials and the adhesive means comprises a first adhesive precoated on the exterior of the body and a second adhesive bonding the pipe to the precoating provided by the first adhesive.

2. The device as claimed in claim 1, wherein the pipe is made of a compliant material resistant to transmission of vibration.

3. The device as claimed in claim 2, wherein the material is a flexible plastics material.

4. The device as claimed in claim 3, wherein the material is polyperfluoroalkoxyethylene.

5. The device as claimed in claim 1, wherein the material of the body is a ceramic and that of the pipe a plastic.

6. The device as claimed in claim 1, wherein the pipe is helically wound around the body and mutually adjacent windings of the pipe are contiguous.

7. The device as claimed in claim 1, wherein a displacing means is operable to displace the coolant at a rate of substantially 0.30 to 0.50 liters per hour, the displacing means is a pump and the cooling means forms a closed circuit.

8. The device as claimed in claim 7, wherein the cooling means includes a coolant reservoir in which coolant is cooled after heat exchange with the support body.

9. The device as claimed in claim 8, wherein the coolant is a liquid.

10. The device as claimed in claim 9, wherein the liquid is deionised water.

11. The device as claimed in claim 1, wherein the beam influencing means comprise beam deflecting means.

12. The device as claimed in claim 11, wherein the beam deflecting means comprises at least one coil operable by electrical energy to generate an electromagnetic field far deflecting the beam.

13. The device as claimed in claim 1, comprising a tubular shield of ferrite material surrounding the body and pipe to provide shielding against external magnetic interference.

14. The device as claimed in claim 13, wherein the shield is spaced from the pipe by a thermally insulating air gap.

15. An electron beam lithography machine incorporating a device for influencing an electron beam, comprising a support body for positioning in the vicinity of an electron beam, beam influencing means supported by the body and operable by electrical energy to influence the beam when the body is so positioned and cooling means for counteracting temperature rise in the body due to operation of the influencing means, but without inducing vibration adversely affecting the stability of beam position, the cooling means comprising a pipe extending externally around and thermally conductively coupled to the body and serving to conduct coolant for heat exchange with the body over at least a major part of the peripheral area thereof substantially without transmission of vibration to the body and displacing means for movement of the coolant through the pipe in a substantially laminar flow, wherein the device being positioned on the axis of a path for a beam generated by the machine, wherein the pipe is bonded to the support body by adhesive means and wherein the body and the pipe are made of different materials and the adhesive means comprises a first adhesive precoated on the exterior of the body and a second adhesive bonding the pipe to the precoating provided by the first adhesive.

16. The electron beam lithography machine as claimed in claim 15, wherein the pipe is made of a compliant material resistant to transmission of vibration.

17. The electron beam lithography machine as claimed in claim 15, wherein the material of the body is a ceramic and that of the pipe a plastic.

18. The electron beam lithography machine as claimed in claim 15, wherein a displacing means is operable to displace the coolant at a rate of substantially 0.30 to 0.50 liters per hour, the displacing means is a pump and the cooling means forms a closed circuit.

19. The electron beam lithography machine as claimed in claim 18, wherein the cooling means includes a coolant reservoir in which coolant is cooled after heat exchange with the support body.

20. The electron beam lithography machine as claimed in claim 19, wherein the coolant is a liquid.

21. The electron beam lithography machine as claimed in claim 15, wherein the beam influencing means comprise beam deflecting means.

22. The electron beam lithography machine as claimed in claim 21, wherein the beam deflecting means comprises at least one coil operable by electrical energy to generate an electromagnetic field for deflecting the beam.

23. The electron beam lithography machine as claimed in claim 15, comprising a tubular shield of ferrite material surrounding the body and pipe to provide shielding against external magnetic interference.

* * * * *